United States Patent
Yamada

(10) Patent No.: US 10,365,306 B2
(45) Date of Patent: Jul. 30, 2019

(54) DETECTION CIRCUIT

(71) Applicant: LAPIS Semiconductor Co., Ltd., Yokohama (JP)

(72) Inventor: Toshimi Yamada, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 111 days.

(21) Appl. No.: 15/717,468

(22) Filed: Sep. 27, 2017

(65) Prior Publication Data

US 2018/0088156 A1   Mar. 29, 2018

(30) Foreign Application Priority Data

Sep. 28, 2016   (JP) .................................. 2016-189035

(51) Int. Cl.
| | |
|---|---|
| G01R 19/00 | (2006.01) |
| H03K 5/08 | (2006.01) |
| G01R 19/165 | (2006.01) |
| H03K 3/037 | (2006.01) |
| H03K 5/24 | (2006.01) |
| H03K 19/20 | (2006.01) |

(52) U.S. Cl.
CPC ....... *G01R 19/16533* (2013.01); *H03K 3/037* (2013.01); *H03K 5/24* (2013.01); *H03K 5/2472* (2013.01); *H03K 19/20* (2013.01)

(58) Field of Classification Search
CPC .. G01R 19/00; G01R 19/16533; H03K 3/012; H03K 3/037; H03K 5/24; H03K 5/2472; G09G 3/3266; G09G 3/3677; G09G 3/3688; G09G 3/3696
See application file for complete search history.

(56) References Cited

U.S. PATENT DOCUMENTS

| | | | | |
|---|---|---|---|---|
| 5,488,324 A | * | 1/1996 | Mizuta | .................... B60T 8/885 327/319 |
| 6,028,468 A | * | 2/2000 | Menniti | ......... H03K 19/018521 326/62 |

FOREIGN PATENT DOCUMENTS

JP    2000-055946 A    2/2000

* cited by examiner

*Primary Examiner* — Minh N Tang
(74) *Attorney, Agent, or Firm* — Rabin & Berdo, P.C.

(57) ABSTRACT

A detection circuit, provided in a gamma buffer circuit that includes at least one transistor that receives the application of a first voltage and generates gradation voltages on the basis of a plurality of gamma voltages, includes: a first comparison circuit that compares the largest gamma voltage with a substrate potential of the transistor and outputs a first comparison result signal, a second comparison circuit that includes an inverter which is operable under a second voltage as a source voltage, compares a threshold voltage of the inverter with the substrate potential, and outputs a second comparison result signal; and a detection result output circuit for outputting a detection result showing if the voltage decrease or power discontinuity of the first voltage is occurring on the basis of the first comparison result signal and the second comparison result signal.

5 Claims, 3 Drawing Sheets

DETECTION CIRCUIT

BACKGROUND OF THE INVENTION

1. Field of the Invention

The present invention relates to a detection circuit for detecting voltage decrease or power discontinuity.

2. Description of the Related Art

Techniques using an in-vehicle display have received attention in recent years. For example, using a camera and a monitor as a substitute for a door mirror has been under consideration. When a monitor is used in place of a door mirror, the occurrence of power discontinuity in a source driver for controlling the monitor needs to be instantaneously detected as abnormality for the sake of safety.

A high-voltage power source (hereinafter denoted as "VLS," for example, 16 V) is used as a power source for a source driver of a liquid crystal display (LCD) or the like. The high-voltage power source VLS provided to the source driver may experience decrease in its voltage level due to various causes. Thus, the detection of voltage decrease in the VLS power source is performed by detecting how much the voltage level has been decreased relative to a low-voltage logic power source (hereinafter denoted as "VDD," for example, 3 V). For example, the detection of voltage decrease in the VLS power source is performed by using an inverter circuit composed of a high-voltage resistant transistor operating with the VDD power source to compare a voltage of the VLS power source with a threshold voltage of the inverter. When the threshold voltage of the inverter is ($\frac{1}{2}$)VDD, the output of the inverter in the case of the VLS power source greater than or equal to ($\frac{1}{2}$)VDD corresponds to a logic level 0 (L level). When the VLS power source is decreased to be smaller than ($\frac{1}{2}$)VDD, on the other hand, the output of the inverter changes from the logic level 0 (L level) to a logic level 1 (H level) (for example, Japanese Patent Application Laid-open No. 2000-55946).

SUMMARY OF THE INVENTION

The source driver of the LCD or the like is provided with a gamma buffer circuit that generates gradation voltages to be applied to a liquid crystal panel. The gamma buffer circuit operates on the basis of the VLS power source, and generates the gradation voltages on the basis of gamma voltages. Among the gamma voltages (GMA0 to GMAn: n is a natural number), the largest voltage (GMA0) has a voltage value of (VLS−0.2 V), for example. In a normal condition, a substrate potential (a back-gate voltage) of a metal-oxide-semiconductor field-effect transistor (MOSFET, hereinafter referred to simply as a transistor) in the gamma buffer circuit equals VLS, which is an operating voltage of the gamma buffer circuit.

If the power discontinuity of the VLS power source occurs in the source driver including such a gamma buffer circuit, the substrate potential of the transistor in the gamma buffer circuit is a voltage resulting from voltage decrease (also referred to as fall by diode) of the largest voltage GMA0 by a parasitic diode between a source terminal and a drain terminal of the transistor and the back gate. Thus, the voltage level of the substrate potential is not decreased to be smaller than ($\frac{1}{2}$)VDD. Therefore, with the conventional circuit that detects decrease in the VLS voltage level on the basis of whether the voltage level of the substrate potential has been decreased to be smaller than ($\frac{1}{2}$)VDD, the power discontinuity cannot be detected on the basis of the voltage value of the substrate potential of the transistor in the gamma buffer circuit.

In order to solve the aforementioned problem, it is an object of the present invention to provide a detection circuit capable of detecting the decrease or power discontinuity of a source voltage on the basis of a substrate potential of a transistor in a gamma buffer circuit.

According to one aspect of the present invention, a detection circuit, provided in a gamma buffer circuit configured to include at least one transistor that receives application of a first voltage and to generate gradation voltages on the basis of a plurality of gamma voltages, includes: a first comparison circuit for comparing a largest gamma voltage having a largest voltage value among the plurality of gamma voltages with a substrate potential of the transistor and outputting a first comparison result signal which is indicative of a result of the comparison, a second comparison circuit, including an inverter which is operable under a second voltage as a source voltage, for comparing a threshold voltage of the inverter with the substrate potential and outputting a second comparison result signal which is indicative of a result of the comparison; and a detection result output circuit for outputting a detection result showing if voltage decrease or power discontinuity of the first voltage is occurring on the basis of the first comparison result signal and the second comparison result signal.

According to the detection circuit of the present invention, the decrease or power discontinuity of the source voltage can be detected on the basis of the substrate potential of the transistor in the gamma buffer circuit.

BRIEF DESCRIPTION OF THE DRAWINGS

The features of the present invention will be described in the following description with reference to the accompanying drawings, which are.

DETAILED DESCRIPTION OF THE INVENTION

An embodiment of the present invention will now be described below with reference to the drawings.

Figure 1:
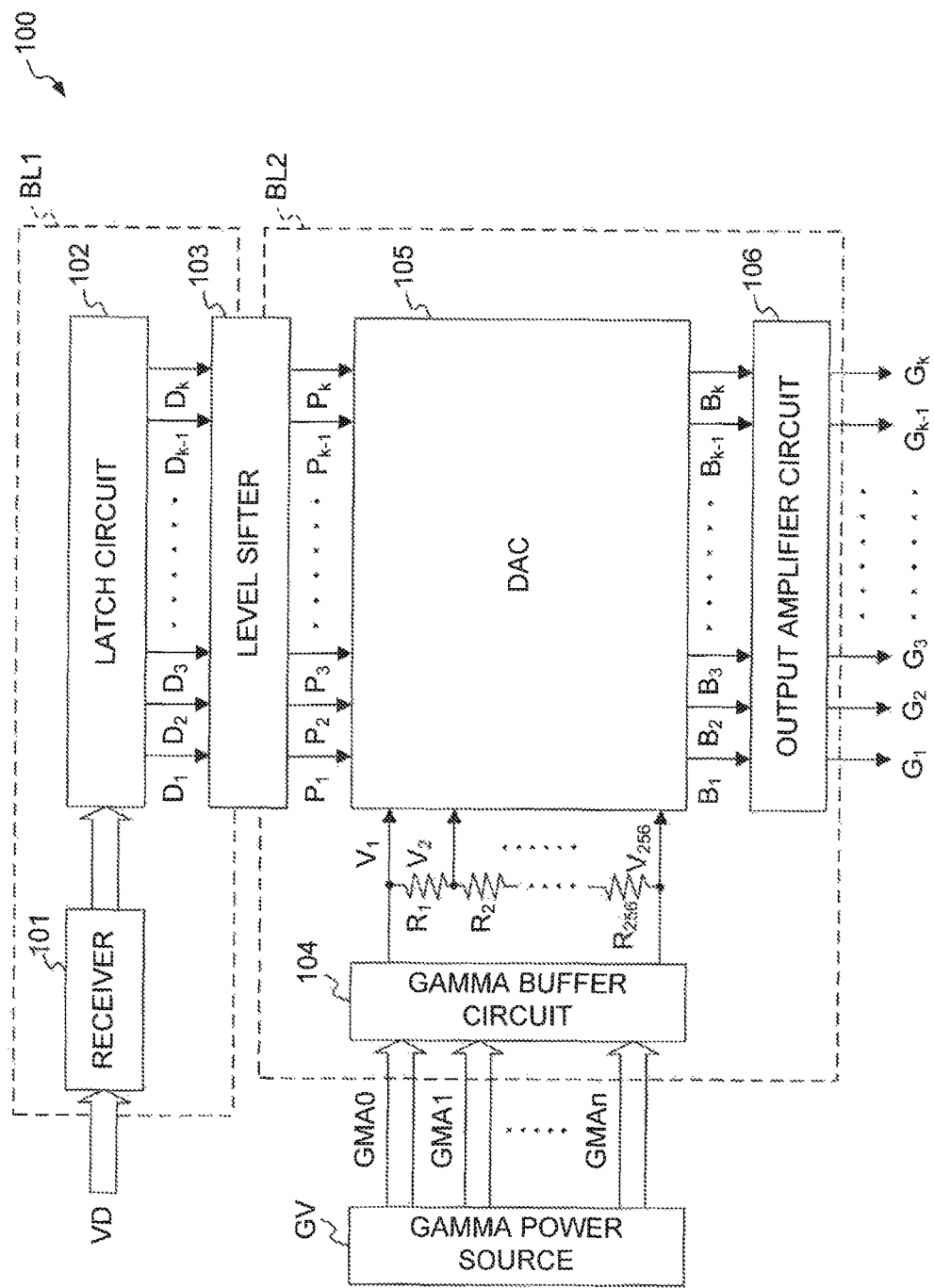
FIG. 1 is a block diagram illustrating a configuration of a source driver circuit.

FIG. 1 is a block diagram illustrating a configuration of a source driver circuit 100 in which a detection circuit of the present invention is provided. The source driver circuit 100 includes a receiver 101, a latch circuit 102, a level shifter 103, a gamma buffer circuit 104, a digital analog converter (DAC) 105, and an output amplifier circuit 106. Gamma voltages GMA0 to GMAn (n is a natural number) are provided to the gamma buffer circuit 104 from a gamma power source GV.

The source driver circuit 100 includes a first block BL1 and a second block BL2. The second block BL2 operates using a source voltage of a high-voltage power source (hereinafter referred to as a source voltage VLS), which is a first voltage, as an operating voltage. The first block BL1 operates using a source voltage of a logic power source (hereinafter referred to as a logic voltage VDD), which is a second voltage, as an operating voltage. The first block BL1 includes the receiver 101 and the latch circuit 102. The second block BL2 includes the gamma buffer circuit 104, the DAC 105, and the output amplifier circuit 106. The level shifter 103 is provided between the first block BL1 and the second block BL2.

The receiver 101 receives a video data signal VD including a sequence of pixel data representing a luminance level of each pixel, for example, by a 6-bit luminance gradation from a display control device such as a Timing Controller (TCON), and provides the received signal to the latch circuit 102.

The latch circuit 102 captures the sequence of pixel data on the basis of the video data signal VD provided by the receiver 101, and provides the captured data to the level shifter 103 as pixel data $D_1$ to $D_k$.

The level shifter 103 shifts the signal level of the pixel data $D_1$ to $D_k$ from the voltage level of the logic voltage VDD to the voltage level of the source voltage VLS. The level shifter 103 provides the level-shifted pixel data to the DAC 105 as pixel data $P_1$ to $P_k$.

The gamma buffer circuit 104 includes a voltage follower circuit, for example, and retains the gamma voltages GMA0 to GMAn provided by the gamma power source GV. Among the gamma voltages GMA0 to GMAn, the gamma voltage GMA0 has the largest voltage value, and the gamma voltage GMAn has the smallest voltage value. The gamma voltage GMA0 corresponding to the largest gamma voltage (hereinafter referred to as the largest gamma voltage GMA0) has a voltage value smaller than the source voltage VLS by a predetermined voltage value (for example, 0.2 V).

The gamma buffer circuit 104 provides the gamma voltages GMA0 to GMAn provided by the gamma power source GV to ladder resistors $R_1$ to $R_{256}$ at predetermined timing. The ladder resistors $R_1$ to $R_{256}$ output gradation voltages $V_1$ to $V_{256}$ from output taps connected to both ends of the respective resistors and provide the gradation voltages $V_1$ to $V_{256}$ to the DAC 105.

The gamma buffer circuit 104 includes a metal-oxide-semiconductor field-effect transistor (MOSFET, hereinafter referred to simply as a transistor), which operates under the application of the source voltage VLS, in the former stage thereof at which the gamma voltages GMA0 to GMAn are received. In the following description, a substrate potential (i.e., a back-gate potential) of the transistor is referred to as a substrate potential SV.

The DAC 105 selects from among the gradation voltages $V_1$ to $V_{256}$ in accordance with the pixel data $P_1$ to $P_k$, and provides the selected gradation voltages to the output amplifier circuit 106 as gradation luminance voltages $B_1$ to $B_k$.

The output amplifier circuit 106 applies voltages that are obtained by amplifying the gradation luminance voltages $B_1$ to $B_k$ to data lines of a display panel (not shown) as pixel drive voltages $G_1$ to $G_k$.

If power discontinuity of the source voltage VLS occurs in such a source driver circuit 100 due to the disconnection of a power line, for example, the substrate potential SV of the transistor in the gamma buffer circuit 104 decreases from the voltage level of the source voltage VLS to the voltage level corresponding to the largest gamma voltage GMA0.

Figure 2A:
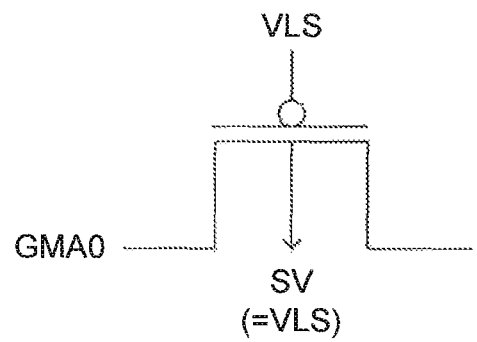
FIGS. 2A and 2B are schematic diagrams each showing a relationship among a source voltage VLS, a largest gamma voltage GMA0, and a substrate potential SV in a transistor in a gamma buffer circuit.
Figure 2B:
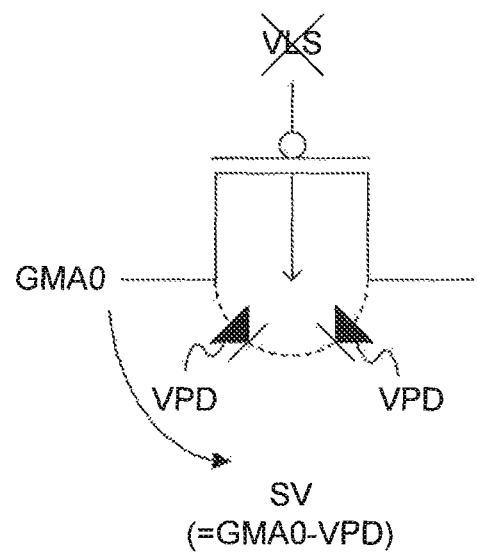

FIGS. 2A and 2B are schematic diagrams each showing a relationship among the substrate potential SV of the transistor that receives the largest gamma voltage GMA0 among transistors in the gamma buffer circuit 104, the source voltage VLS, and the largest gamma voltage GMA0. A case where the transistor is a P-channel MOS transistor is herein shown as an example. In a normal condition without the power discontinuity of the source voltage VLS (FIG. 2A), the substrate potential SV equals the source voltage VLS. When the power discontinuity of the source voltage VLS is occurring (FIG. 2B), however, the substrate potential SV has a voltage level corresponding to a voltage dropped by a parasitic diode voltage VPD (for example, 0.7 V) from the largest gamma voltage GMA0.

Figure 3:
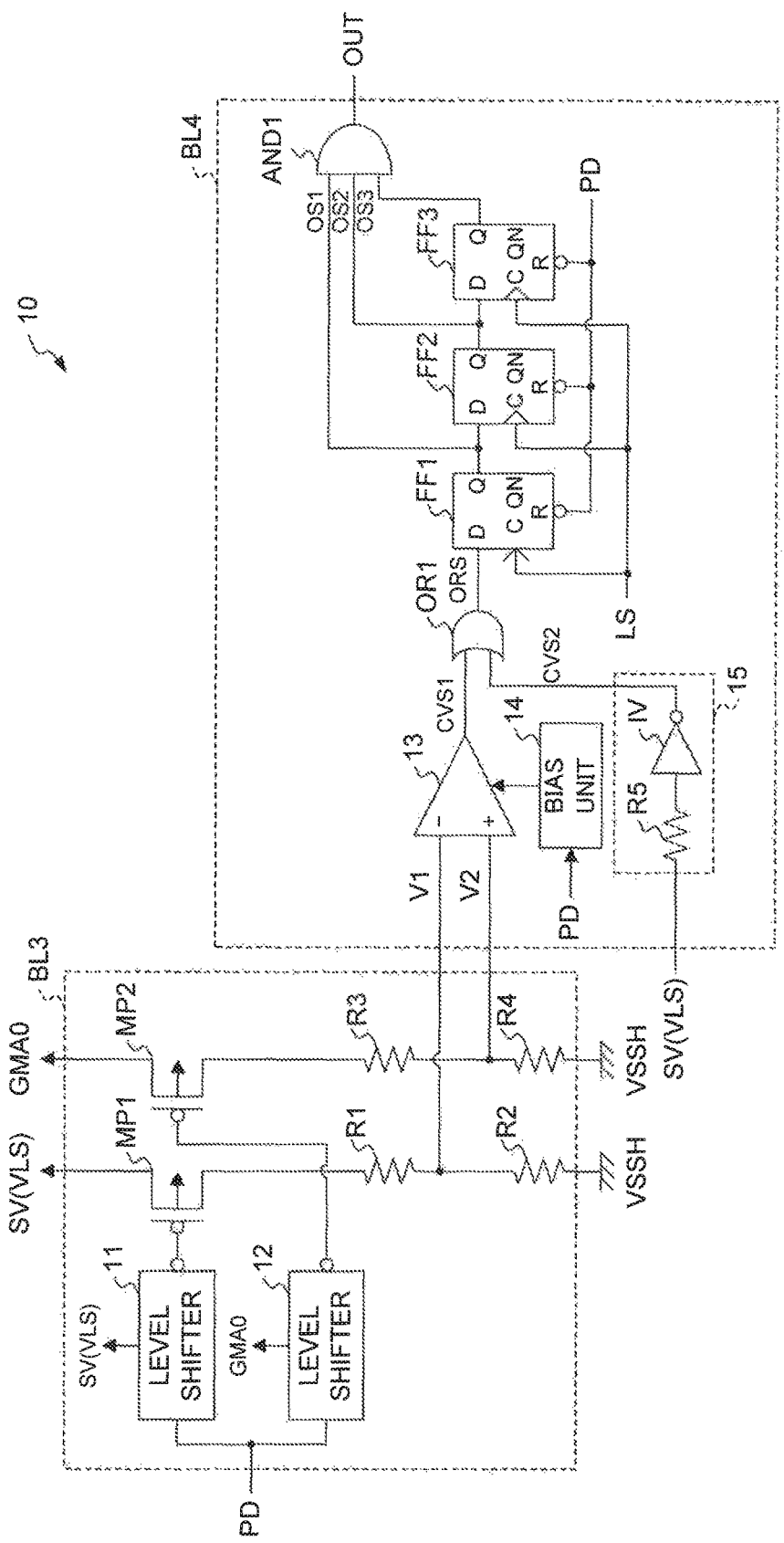
FIG. 3 is a block diagram illustrating a configuration of a detection circuit according to the present invention.

FIG. 3 is a block diagram illustrating a configuration of a detection circuit 10 of the present invention. The detection circuit 10 is provided, for example, in the gamma buffer circuit 104 in the source driver circuit 100. The detection circuit 10 is a circuit for detecting the voltage decrease and power discontinuity of the source voltage VLS on the basis of the substrate potential SV of the transistor in the gamma buffer circuit 104. Since the substrate potential SV equals the voltage level of the source voltage VLS in the normal condition without the power discontinuity, the substrate potential is shown as "SV (VLS)" in the figure.

The detection circuit 10 includes: a voltage shift block BL3 for shifting the voltage levels of the substrate potential SV and the gamma voltage GMA0; and a detection block BL4 for detecting the voltage decrease and power discontinuity of the source voltage VLS on the basis of the substrate potential SV. The detection block BL4 is a block operating on the basis of the logic voltage VDD. Thus, the voltage shift block BL3 functions to convert the substrate potential SV and the gamma voltage GMA0 to the voltage level of the logic voltage VDD and provide the converted substrate potential SV and gamma voltage GMA0 to a comparison circuit (comparator) in the detection block BL4.

The voltage shift block BL3 includes level shifters 11 and 12, transistors MP1 and MP2, and resistors R1, R2, R3, and R4. The voltage shift block BL3 is controlled to either one of an ON state and an OFF state in accordance with the signal level of a power-down signal PD. The power-down signal PD is a signal having a signal level changing between a logic level 0 and a logic level 1. In the following description, the logic level 0 is referred to as a low level (L), and the logic level 1 is referred to as a high level (H).

The level shifter 11 shifts the signal level of the power-down signal PD to the voltage level of the source voltage VLS. The level-shifted power-down signal PD is inverted and is provided to a gate terminal of the transistor MP1. The level shifter 12 shifts the signal level of the power-down signal PD to the voltage level of the largest gamma voltage GMA0. The level-sifted power down signal PD is inverted and is provided to a gate terminal of the transistor MP2.

The transistors MP1 and MP2 are P-channel (first channel) MOS transistors. In the transistor MP1, a drain terminal thereof is connected to one end of the resistor R1, and the substrate potential SV is applied to a source terminal thereof. In the transistor MP2, a drain terminal thereof is connected to one end of the resistor R3, and the largest gamma voltage GMA0 is applied to a source terminal thereof.

The other end of the resistor R1 is connected to one end of the resistor R2. The other end of the resistor R2 is connected to a high-voltage ground potential VSSH. A connection point between the resistors R1 and R2 is connected to a minus input terminal of a comparator 13. The resistors R1 and R2 convert the voltage level of the substrate potential SV to the level of the logic voltage VDD to generate a voltage V1, and provide the voltage V1 to the comparator 13.

The other end of the resistor R3 is connected to one end of the resistor R4. The other end of the resistor R4 is connected to the high-voltage ground potential VSSH. A connection point between the resistors R3 and R4 is connected to a plus input terminal of the comparator 13. The resistors R1 and R2 convert the voltage level of the largest gamma voltage GMA0 to the level of the logic voltage VDD to generate a voltage V2, and provide the voltage V2 to the comparator 13.

The resistance values of the resistors R1, R2, R3, and R4 are set to resistance values capable of converting the voltage levels of the substrate potential SV and the largest gamma voltage GMA0 to the level of the logic voltage VDD while maintaining a magnitude relationship between the substrate potential SV and the largest gamma voltage GMA0 and making currents flowing through the resistors equal to one another in consideration of variation in resistance ratio. For example, the resistance value of the resistor R1 is set to 429.1 kΩ, the resistance value of the resistor R2 is set to 70.9 kΩ, the resistance value of the resistor R3 is set to 431 kΩ, and the resistance value of the resistor R4 is set to 69 kΩ. In this case, the sum of the resistors R1 and R2 and the sum of the resistors R3 and R4 are both equal to 500 kΩ.

The detection block BL4 includes the comparator 13, a bias unit 14, a circuit 15 for determining voltage decrease, an OR circuit OR1, flip-flops FF1 to FF3, and an AND circuit AND1.

The comparator 13 is connected to the bias unit 14, which serves as a current source and receives the power-down signal PD as an input. In other words, the comparator 13 is controlled to an ON state or an OFF state in accordance with the signal level of the power-down signal PD. The comparator 13 compares the voltage values of the voltages V1 and V2, and provides a comparison result signal CVS1 indicative of the comparison result to one of input terminals of the OR circuit OR1. When the voltage V1 is greater than or equal to the voltage V2, the comparison result signal CVS1 is at the low level (L). When the voltage V1 is smaller than the voltage V2, on the other hand, the comparison result signal CVS1 is at the high level (H).

The circuit 15 for determining voltage decrease is composed of a resistor R5 and an inverter IV. The inverter IV is a circuit operating on the basis of the logic voltage VDD and has a threshold voltage of ($\frac{1}{2}$)VDD. The substrate potential SV is inputted to the inverter IV via the resistor R5. The inverter IV outputs a comparison result signal CVS2 having a signal level changing between the low level (L) and the high level (H) on the basis of a magnitude relationship between the voltage level of the inputted voltage (i.e., the substrate potential SV) and the threshold voltage of ($\frac{1}{2}$) VDD. Specifically, the inverter IV outputs the comparison result signal CVS2 at the low level (L) when the substrate potential SV is greater than or equal to the threshold voltage of ($\frac{1}{2}$)VDD. When the substrate potential SV is smaller than the threshold voltage of ($\frac{1}{2}$)VDD, on the other hand, the inverter IV outputs the comparison result signal CVS2 at the high level (H). The circuit 15 for determining voltage decrease provides the comparison result signal CVS2 to the other one of the input terminals of the OR circuit OR1.

The OR circuit OR1 outputs an OR signal ORS which is the logical sum of the comparison result signals CVS1 and CVS2, and provides the OR signal ORS to a D input terminal of the flip-flop FF1.

In the flip-flop FF1, a latch signal LS is provided to a clock terminal C, and an inverted signal of the power-down signal PD is provided to a reset terminal R. The flip-flop FF1 captures the OR signal ORS in accordance with clock timing of the latch signal LS, and outputs the captured signal as an output signal OS1 from an output terminal Q at the next clock timing. The flip-flop FF1 provides the output signal OS1 to a D input terminal of the flip-flop FF2 and the AND circuit AND1. In the flip-flop FF2, the latch signal LS is provided to a clock terminal C, and the inverted signal of the power-down signal PD is provided to a reset terminal R. The flip-flop FF2 captures the output signal OS1 from the flip-flop FF1 in accordance with clock timing of the latch signal LS, and outputs the captured signal as an output signal OS2 from an output terminal Q at the next clock timing. The flip-flop FF2 provides the output signal OS2 to a D input terminal of the flip-flop FF3 and the AND circuit AND1.

In the flip-flop FF3, the latch signal LS is provided to a clock terminal C, and the inverted signal of the power-down signal PD is provided to a reset terminal R. The flip-flop FF3 captures the output signal OS2 from the flip-flop FF2 in accordance with clock timing of the latch signal LS, and outputs the captured signal as an output signal OS3 from an output terminal Q at the next clock timing. The flip-flop FF3 provides the output signal OS3 to the AND circuit AND1.

By such operations of the flip-flops FF1 to FF3, the OR signals ORS for consecutive three clock periods are outputted to the AND circuit AND1. In other words, the flip-flops FF1 to FF3 have a function as a retaining circuit for retaining the OR signals ORS for three clock periods in synchronization with the latch signal LS.

The AND circuit AND1 is a three-input AND circuit, and outputs an AND signal OUT which is the logical product of the output signal OS1 from the flip-flop FF1, the output signal OS2 from the flip-flop FF2, and the output signal OS3 from the flip-flop FF3. The output signals OS1, OS2, and OS3 correspond to the OR signals ORS for consecutive three clock periods. Thus, the AND signal OUT is the logical product of the OR signals ORS for the three clock periods. In other words, the AND circuit AND1 is a detection result output circuit for outputting a detection result about voltage decrease or power discontinuity on the basis of the OR signals ORS for the three clock periods.

Operations of the detection circuit 10 will be described next. First, when the power-down signal PD is changed from the low level (L) to the high level (H), the detection circuit 10 transitions to an operating mode. More specifically, the signal at the low level (L) is provided to the gate terminals of the transistors MP1 and MP2 to turn ON the transistors MP1 and MP2. An operating current is provided to the comparator 13, and the inverted signal of the power-down signal PD at the low level (L) is provided to the reset terminals R of the flip-flops FF1 to FF3.

The transistor MP1 in an ON state provides a voltage that is obtained by dividing the substrate potential SV by the resistors R1 and R2 to the minus input terminal of the comparator 13. Also, the transistor MP2 in an ON state provides a voltage that is obtained by dividing the largest gamma voltage GMA0 by the resistors R3 and R4 to the plus input terminal of the comparator 13.

In the normal condition (i.e., the condition without the power discontinuity of the source voltage VLS), the voltage value of the substrate potential SV equals the voltage value of the source voltage VLS. Since the voltage value of the largest gamma voltage GMA0 corresponds to (VLS−0.2 V), the substrate potential SV is greater than the largest gamma voltage GMA0. Thus, the voltage provided to the minus input terminal of the comparator 13 becomes greater than the voltage provided to the plus input terminal thereof, and the signal level of the comparison result signal CVS1, which is the output of the comparator 13, becomes the low level (L).

When the power discontinuity of the source voltage VLS is occurring, on the other hand, the substrate potential SV has a voltage value corresponding to the voltage dropped by the parasitic diode voltage VPD (i.e., 0.7 V) from the largest gamma voltage GMA0. Therefore, it is satisfied that the largest gamma voltage GMA0>the substrate potential SV. Thus, the voltage provided to the plus input terminal of the comparator 13 becomes greater than the voltage provided to the minus input terminal thereof, and the signal level of the comparison result signal CVS1, which is the output of the comparator 13, becomes the high level (H).

The circuit 15 for determining voltage decrease compares the substrate potential (SV) with the threshold voltage of the inverter IV, or (½)VDD. In the normal condition without voltage decrease in the source voltage VLS, since the source voltage VLS>the logic voltage VDD, the substrate potential SV is greater than the threshold voltage of (½)VDD. Thus, the circuit 15 for determining voltage decrease outputs the comparison result signal CVS2 at the low level (L). When the substrate potential SV becomes smaller than the threshold voltage of (½)VDD as the result of the occurrence of voltage decrease in the source voltage VLS, on the other hand, the circuit 15 for determining voltage decrease outputs the comparison result signal CVS2 at the high level (H).

When either one or both of the comparison result signals CVS1 and CVS2 are at the high level (H), the OR circuit OR1 outputs the OR signal ORS at the high level (H). In other words, the OR circuit OR1 outputs the OR signal ORS at the high level (H) when the comparator 13 and the circuit 15 for determining voltage decrease determine that the power discontinuity or voltage decrease of the source voltage VLS is occurring. In contrast to this, when both of the comparison result signals CVS1 and CVS2 are at the low level (L), i.e., when the comparator 13 and the circuit 15 for determining voltage decrease determine that neither the power discontinuity nor voltage decrease of the source voltage VLS is occurring, the OR circuit OR1 outputs the OR signal ORS at the low level (L).

By the operations of the flip-flops FF1 to FF3, the OR signals ORS for three clock periods of the latch signal LS are captured and provided to the AND circuit AND1. When the OR signals ORS for the three clock periods are all at the high level (H), the AND circuit AND1 outputs the AND signal OUT at the high level (H). When any one of the OR signals ORS for the three clock periods is at the low level (L), on the other hand, the AND circuit AND1 outputs the AND signal OUT at the low level (L).

In other words, when the power discontinuity or voltage decrease of the source voltage VLS is detected over three clock periods, the signal level of the AND signal OUT becomes the high level (H). When no power discontinuity or voltage decrease of the source voltage VLS is detected in any one of the three clock periods, on the other hand, the signal level of the AND signal OUT becomes the low level (L). Thus, by determining whether the signal level of the AND signal OUT is the low level (L) or the high level (H), an abnormal condition due to the voltage decrease or power discontinuity of the source voltage VLS can be detected.

As described above, the detection circuit 10 of the present invention detects if the power discontinuity of the source voltage VLS is occurring by comparing the substrate potential SV in the gamma buffer circuit 104 with the largest gamma voltage GMA0. This enables the detection of the power discontinuity of the source voltage VLS on the basis of the substrate potential SV even when decrease in the substrate potential SV stops at a level corresponding to the voltage dropped by the parasitic diode voltage VPD from the largest gamma voltage GMA0 without decreasing to the threshold voltage of the inverter IV (½ of the logic voltage VDD) as described with reference to FIG. 2B.

In addition to the detection of the power discontinuity of the source voltage VLS, the detection circuit 10 of the present invention detects that the voltage level of the source voltage VLS has been decreased to be smaller than (½)VDD and calculates the logic sum thereof. Thus, the detection circuit 10 of the present invention can detect a case when at least one of the power discontinuity and voltage decrease of the source voltage VLS is occurring as an abnormal condition.

Moreover, the detection circuit 10 of the present invention determines that abnormality is occurring when the power discontinuity or voltage decrease of the source voltage VLS is detected over three clock periods. Thus, abnormality determination based on false detection can be prevented from occurring.

Note that the present invention is not limited to the aforementioned embodiment. For example, in the aforementioned embodiment, the detection block BL4 including the comparator 13, the bias unit 14, the circuit 15 for determining voltage decrease, the OR circuit OR1, the flip-flops FF1 to FF3, and the AND circuit AND1 operates on the basis of the logic voltage VDD, and the voltage shift block BL3 operates on the basis of the source voltage VLS and the largest gamma voltage GMA0. However, a boundary between what is called a low-voltage system, which operates on the basis of the logic voltage VDD, and what is called a high-voltage system, which operates on the basis of the source voltage VLS and the largest gamma voltage GMA0, is not limited to that described in the aforementioned embodiment.

The resistance values of the resistors R1, R2, R3, and R4 are not limited to the values described in the aforementioned embodiment. Any resistance values capable of converting the voltage levels of the substrate potential SV and the largest gamma voltage GMA0 to the level of the logic voltage VDD while maintaining a magnitude relationship between the substrate potential SV and the largest gamma voltage GMA0 may be employed. Also, resistance values may have a trimming function capable of adjusting resistance values in consideration of variation in resistance.

In the aforementioned embodiment, the detection circuit 10 includes the flip-flops FF1 to FF3, retains the OR signals ORS for three clock periods, and outputs the logical product of those OR signals. The number of the flip-flops, however, is not limited thereto. In other words, any detection circuit 10 that has m (m is an integer greater than or equal to two) flip-flops, retains the OR signals ORS for m clock periods, and outputs the logical product of those OR signals may be employed.

Moreover, the prevention of false detection may be further improved by providing a filter circuit between the comparator 13 and the flip-flop FF1 (for example, between the comparator 13 and the OR circuit OR1 or between the OR circuit OR1 and the flip-flop FF1) and providing an output of the filter circuit to the OR circuit OR1 or the flip-flop FF1.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims.

This application is based upon and claims the benefit of priority from the prior Japanese Patent Application No. 2016-189035 filed on Sep. 28, 2016, the entire contents of which are incorporated herein by reference.

What is claimed is:

1. A detection circuit provided in a gamma buffer circuit configured to include at least one transistor that receives application of a first voltage and to generate gradation voltages on the basis of a plurality of gamma voltages, the detection circuit comprising:
   a first comparison circuit for comparing a largest gamma voltage having a largest voltage value among the plurality of gamma voltages with a substrate potential of the transistor and outputting a first comparison result signal which is indicative of a result of the comparison,
   a second comparison circuit, including an inverter which is operable under a second voltage as a source voltage, for comparing a threshold voltage of the inverter with the substrate potential and outputting a second comparison result signal which is indicative of a result of the comparison; and
   a detection result output circuit for outputting a detection result showing if voltage decrease or power discontinuity of the first voltage is occurring on the basis of the first comparison result signal and the second comparison result signal.

2. The detection circuit according to claim 1, further comprising an OR circuit for outputting an OR signal representing a logical sum of the first comparison result signal and the second comparison result signal, so as to determine if at least one of the voltage decrease and the power discontinuity of the first voltage is occurring on the basis of the OR signal.

3. The detection circuit according to claim 2, further comprising a retaining circuit for capturing the OR signal in synchronization with a clock signal and retaining the OR signal over consecutive n clock periods of the clock signal, wherein n is an integer greater than or equal to two; wherein
   the detection result output circuit outputs the detection result showing if at least one of the voltage decrease and the power discontinuity of the first voltage is occurring on the basis of a signal level of the OR signal for the n clock periods.

4. The detection circuit according to claim 3, wherein
   the retaining circuit comprises first to n-th flip-flops connected in series,
   the first flip-flop among the first to the n-th flip-flops captures, retains for one clock period of the clock signal, and outputs the OR signal,
   a k-th flip-flop among the first to the n-th flip-flops captures, retains for one clock period of the clock signal, and outputs an output signal of a (k−1)-th flip-flop, where 2≤k≤n, and
   the detection result output circuit outputs a detection result showing if at least one of the voltage decrease and the power discontinuity of the first voltage is occurring on the basis of a logical product of outputs of the first to the n-th flip-flops.

5. The detection circuit according to claim 1, comprising a shift circuit for generating a first divided voltage obtained by dividing the substrate potential and shifting a voltage level thereof and a second divided voltage obtained by dividing the largest gamma voltage and shifting a voltage level thereof, wherein
   the first comparison circuit includes a comparator that operates on the basis of the second voltage, and
   the comparator generates the first comparison result signal on the basis of the first divided voltage and the second divided voltage.

* * * * *